United States Patent
Eby et al.

(12)

(10) Patent No.: US 6,683,804 B1
(45) Date of Patent: Jan. 27, 2004

(54) READ/WRITE MEMORY ARRAYS AND METHODS WITH PREDETERMINED AND RETRIEVABLE LATENT-STATE PATTERNS

(75) Inventors: Michael D. Eby, Battle Ground, WA (US); Kenneth Carl Zemlok, Westwood, MA (US); Colin David Duggan, Canton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/198,263

(22) Filed: Jul. 16, 2002

(51) Int. Cl.$^7$ .............................................. G11C 11/03
(52) U.S. Cl. ............. 365/154; 365/189.05; 365/189.11; 365/205
(58) Field of Search ................... 365/154, 189.05, 365/189.11, 230.06, 203, 205

(56) References Cited

U.S. PATENT DOCUMENTS

| | | | |
|---|---|---|---|
| 3,662,351 A | 5/1972 | Ho et al. | |
| 4,004,286 A | 1/1977 | Mrazek | |
| 4,059,826 A | 11/1977 | Rogers | |
| 4,995,004 A | 2/1991 | Lee | |
| 5,040,143 A | 8/1991 | Matsumura et al. | |
| 5,440,513 A | 8/1995 | Smith | |
| 5,986,932 A | * 11/1999 | Ratnakumar et al. | .. 365/185.07 |
| 6,005,810 A | 12/1999 | Wu | |
| 6,061,779 A | * 5/2000 | Garde | ........................ 712/204 |
| 6,108,256 A | * 8/2000 | Schneider | .................... 365/203 |
| 6,181,608 B1 | * 1/2001 | Keshavarzi et al. | ......... 365/188 |
| 6,589,828 B2 | * 7/2003 | Lee | .............................. 438/162 |
| 6,590,800 B2 | * 7/2003 | Chang | ........................ 365/154 |

* cited by examiner

*Primary Examiner*—Richard Elms
*Assistant Examiner*—Nam Nguyen
(74) *Attorney, Agent, or Firm*—Koppel, Jacobs, Patrick & Heybl

(57) ABSTRACT

Static read/write memory structures are provided that include predetermined latent-state patterns which can be retrieved with a latent-state retrieve process that differs somewhat from a conventional write process. The patterns are realized with threshold-voltage differences and they significantly enhance flexibility of memory allocation without increasing memory area nor significantly altering conventional read/write processes.

43 Claims, 5 Drawing Sheets

READ/WRITE MEMORY ARRAYS AND METHODS WITH PREDETERMINED AND RETRIEVABLE LATENT-STATE PATTERNS

BACKGROUND OF THE INVENTION

1. Field of the Invention

The present invention relates generally to integrated-circuit memories.

2. Description of the Related Art

Access to static random access memories (SRAMs) and to read-only memories (ROMs) is required by various integrated circuits (e.g., digital signal processors, microcontrollers and field-programmable gate arrays). These memories are typically supplied as separate and distinct structures and fixed, pre-programmed data is generally stored in the read-only memory with variable data written into and read from the read/write memory.

In many applications, read-only memory is accessed infrequently yet it occupies significant integrated-circuit area. In addition, some applications of a specific integrated circuit require increased amounts of read-only memory while other applications require increased amounts of read/write memory and these conflicting needs are often unpredictable and unknown at time of integrated-circuit fabrication. Increasing both the read-only and the read/write memories has been a conventional response to these contrasting needs but this response is expensive and demands valuable integrated-circuit space.

BRIEF SUMMARY OF THE INVENTION

The present invention is directed to read/write memory arrays that significantly enhance flexibility of memory allocation without increasing memory area nor significantly altering conventional read/write processes.

These goals are realized with a read/write memory that provides predetermined latent-state patterns which are retrieved with a latent-state retrieve process that differs somewhat from a conventional write process.

The novel features of the invention are set forth with particularity in the appended claims. The invention will be best understood from the following description when read in conjunction with the accompanying drawings.

DETAILED DESCRIPTION OF THE INVENTION

Read/write memory embodiments are described below which provide latent-state patterns that can be retrieved with a latent-state retrieve process. Thus, read-only memory functionality is also provided yet the memory area is not increased nor the read/write functions significantly altered. Accordingly, these embodiments provide significant flexibility to the design, fabrication and use of any integrated circuits that have memory requirements.

Figure 1:
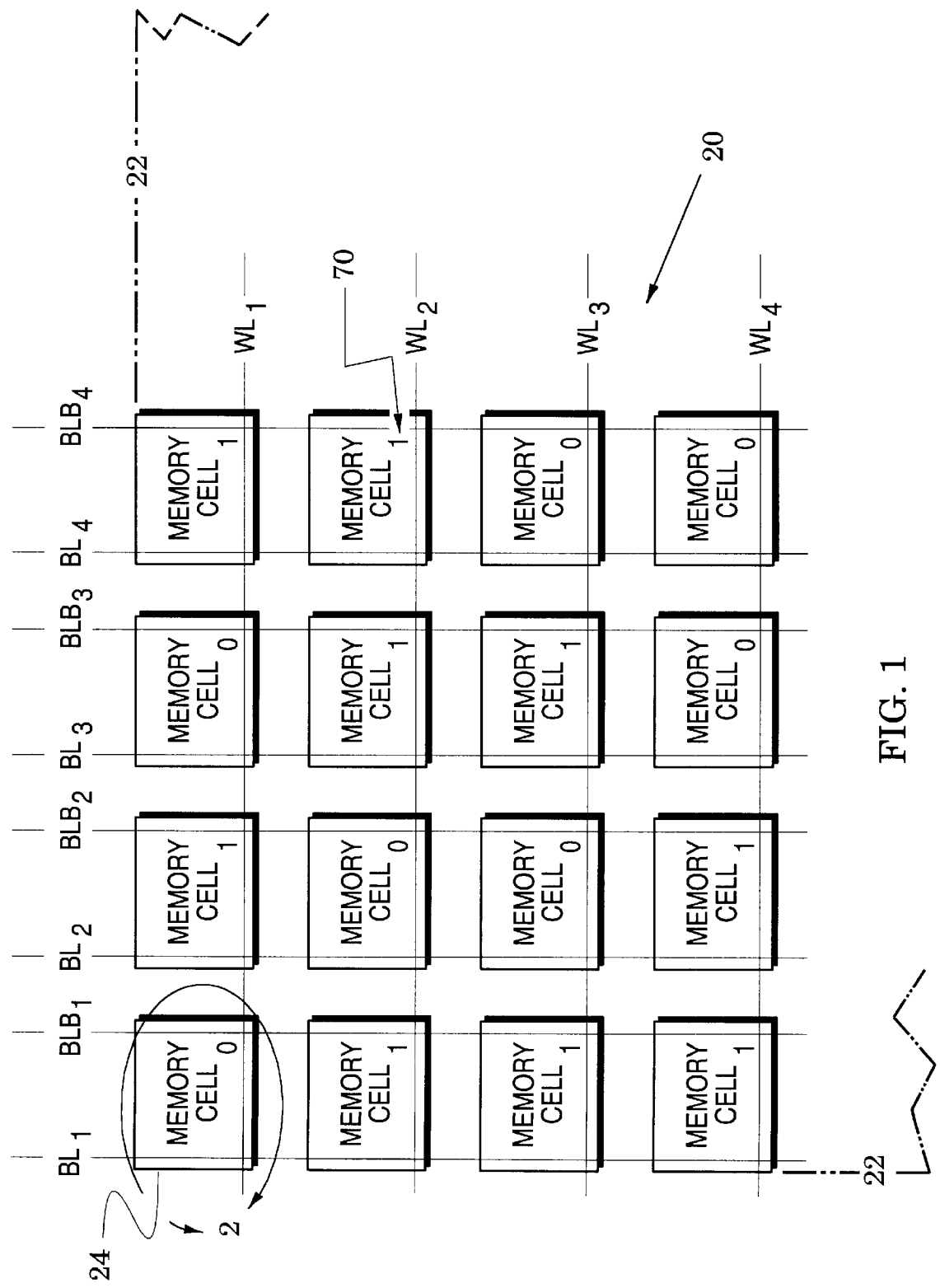
FIG. 1 is a block diagram of a portion of an array of read/write memory cell embodiments of the present invention.

In particular, FIG. 1 illustrates a portion 20 of a larger array 22 of memory cells 24. Word lines (e.g., $WL_1$) are arranged so that each accesses a respective row of the array and pairs of bit lines (e.g., bit line $BL_1$ and its inverse bit line bar $BLB_1$) are arranged so that each pair accesses a respective column of the array.

Figure 2:
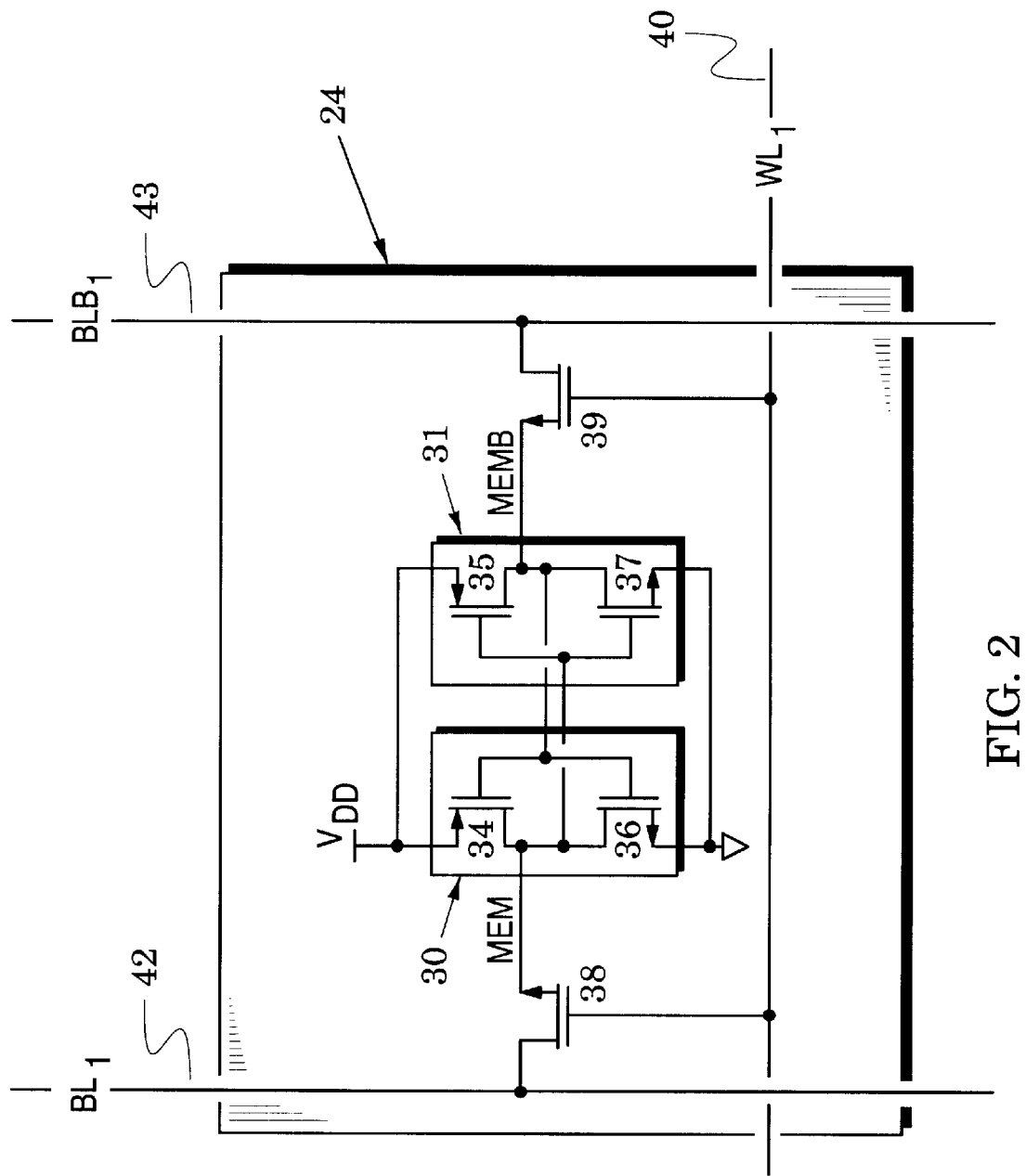
FIG. 2 is an enlarged and detailed diagram of the read/write memory cell within the curved line 2 of FIG. 1.

The memory cell 24 that is within the curved line 2 of FIG. 1 is shown in FIG. 2 to have first and second inverters 30 and 31 that each include pull-up and pull-down transistors. In particular, the first inverter 30 has a pull-up transistor 34 and a pull-down transistor 36 and the second inverter 31 has a pull-up transistor 35 and a pull-down transistor 37. Within each inverter, the pull-up and pull-down transistors are drain-coupled and gate-coupled so that the coupled drains always present a signal that is inverted from a signal on the coupled gates.

The first and second inverters 30 and 31 are cross-coupled, i.e., the coupled gates of each of the inverters 30 and 31 is connected to the coupled drains of the other inverter. Accordingly, if the coupled drains of the inverter 30 successively present bit values 0 and 1, the coupled drains of the inverter 31 will successively present bit values 1 and 0. Thus, the memory cell 24 can be urged into either of first and second stable states.

The memory cell 24 also includes first and second pass transistors 38 and 39 that are respectively connected to the coupled drains of the first and second inverters 30 and 31. A word line 40 is coupled to the gates of the first and second pass transistors 38 and 39, a bit line 42 is coupled to the source of the first pass transistor 38 and a bit line bar 43 (the other of a pair of bit lines of FIG. 1) is coupled to the source of the second pass transistor 39. In the embodiment of FIG. 2, the pull-up transistors 34 and 35 are p-type metal oxide semiconductor (MOS) transistors and the pull-down transistors 35 and 37 and the pass transistors 38 and 39 are n-type MOS transistors.

A first word signal (e.g., a high signal) on the word line will substantially short the first and second pass transistors 38 and 39 to thereby couple signals on the bit lines 42 and 43 to the coupled drains of the first and second inverters 30 and 31 and a different second word signal (e.g., a low signal) on the word line will substantially open the first and second pass transistors 38 and 39 to thereby isolate the first and second inverters. Accordingly, a selected state of the first and second stable states can be written into the memory cell 24 during the presence of the first word signal and the selected state will be maintained during the presence of the second word signal.

A conventional write process of the memory cell 24, for example, begins by applying a bit signal on the bit line 42 and the inverse of that bit signal on the bit line bar 43. A signal that turns on the first and second pass transistors 38 and 39 is then placed on the word line 40. In response, first and second inverters are urged into a selected one of their first and second stable states.

When the signal on the word line 40 subsequently turns off the first and second pass transistors, the first and second inverters remain in the selected state. In a subsequent conventional read process, the bit line 42 and bit line bar 43 can be interrogated after the pass transistors 38 and 39 are turned on by an appropriate signal on the word line 40.

Figure 3:
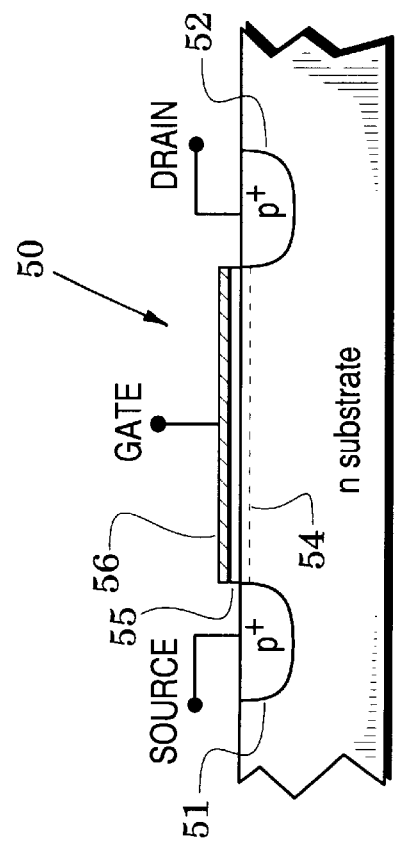
FIG. 3 is an enlarged cross-sectional view through a pull-up transistor of FIG. 2.

The cross-sectional view 50 of FIG. 3 shows that the source 51 and drain 52 of the pull-up transistor 34 are realized with heavily-doped p+ regions that are diffused into an n-type substrate 53 (composed, for example, of silicon). A narrow channel region 54 of the substrate connects the source and drain and is covered by an insulating layer 55 (e.g., silicon dioxide) and a gate electrode 56 (e.g., polysilicon).

As is well known, a thin layer of electrons is induced in the channel region 54 when the gate-to-source voltage $V_{gs}$ reaches a threshold voltage $V_t$. The channel region then forms a conducting channel between the drain 52 and the source 51 and drain current $I_d$ begins to flow through the drain. The magnitude of the drain current increases as the term $V_{gs}-V_t$ increases.

During fabrication, therefore, extra p-type impurities are implanted in the channels of the pull-up transistors 34 and 35 of FIG. 2 to realize a nominal threshold voltage $V_{t_{nom}}$. In accordance with the invention, however, additional impurities are subsequently implanted in the channel of a selected one of the pull-up transistors to realize a greater impurity density and, thereby, a greater threshold voltage $V_{t_{gtr}}$ that exceeds the nominal threshold voltage $V_{t_{nom}}$ and creates a threshold-voltage difference.

As indicated in FIG. 2, the coupled drains of the inverters 30 and 31 are respectively referred to as MEM and MEMB. It is noted that the pull-up transistors 34 and 35 will be turned on and the pull-down transistors 36 and 37 will be turned off if a bit value 0 is simultaneously presented through the first and second pass transistors 38 and 39 to both MEM and MEMB. At this time, the pull-up transistors will be coupled to substantially-equal gate-to-source voltages $V_{gs}$. The selected one of the pull-up transistors 34 and 36 will, however, be conducting a drain current that is related to the term $V_{gs}-V_{t_{gtr}}$ and the other will be conducting a greater drain current that is related to the term $V_{gs}-V_{t_{nom}}$.

Because of symmetry of the memory cell 24, substantially-equal parasitic capacitances are associated with the drains of the pull-up transistors 34 and 35 (i.e., MEM and MEMB). When the pass transistors are subsequently turned off, the selected pull-up transistor will, accordingly, charge its respective parasitic capacitance slower than will the other pull-up transistor that is conducting a greater drain current. Because the feedback coupling between the first and second inverters 30 and 31 enhances any initial voltage difference across the stray capacitances, the memory cell 24 will snap into a selected and predictable one of its first and second stable states.

In particular, the memory cell 24 will snap into the stable state in which the drain of the selected pull-up transistor is low and the drain of the other pull-up transistor is high. This latent state is realized because of the greater threshold voltage $V_{t_{gtr}}$ of the selected pull-up transistor and it will always be retrieved by the latent-state retrieve process described above.

Figure 4:
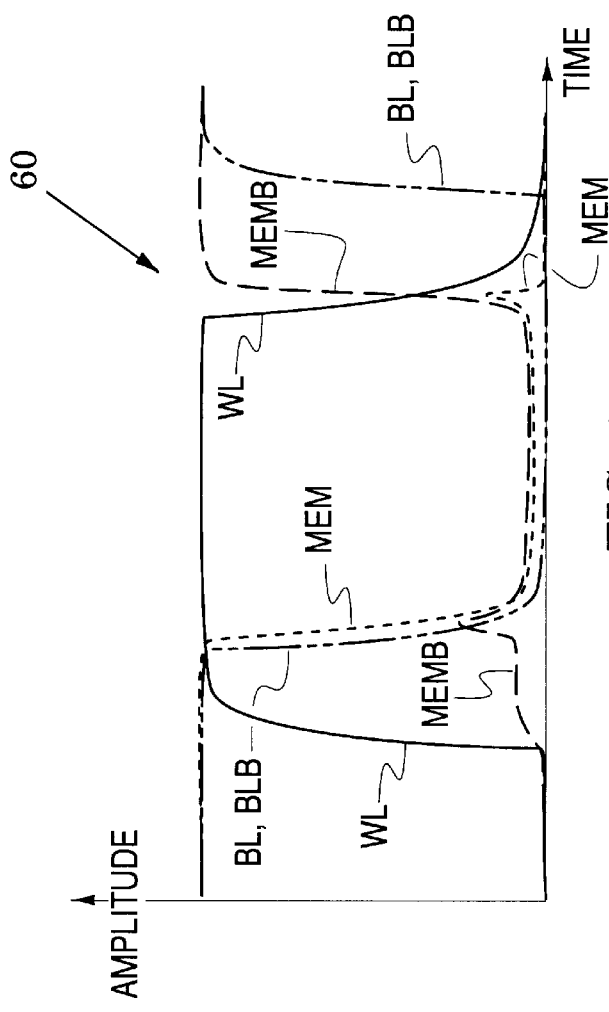
FIG. 4 is a graph that illustrates a process embodiment of the present invention for recalling a latent state in the read/write memory cell of FIG. 2.

The latent-state retrieve process is graphically shown in the graph 60 of FIG. 4 in which it is assumed that the pull-up transistor 34 of FIG. 2 is the selected transistor. That is, the drain current $I_d$ of the pull-up transistor 34 is related to the term $V_{gs}-V_{t_{gtr}}$ and the drain current of the pull-up transistor 35 is related to the term $V_{gs}-V_{t_{nom}}$. FIG. 4 indicates that MEM and MEMB (see FIG. 2) are initially in the stable state wherein MEM is high and MEMB is low. The word line WL then transitions from low to high to permit access to the memory cell (24 in FIG. 2). Bit line BL and bit line bar BLB are subsequently forced to transition from high to low which forces MEM and MEMB to be low also.

When the word line WL subsequently transitions from high to low, the memory cell is isolated by virtue of the fact that the pass transistors are off. Because the drain current of the pull-up transistor 35 exceeds the drain current of the pull-up transistor 34, the memory cell quickly snaps to the implanted latent stable state in which MEM is low and MEMB is high. Once the memory cell has been isolated, the bit line BL and bit line bar BLB may safely transition back to high without affecting the latent state. The previously latent state can then be read by conventional read processes.

It is noted that the latent-state retrieve process illustrated in FIG. 4 is similar to a conventional write process. The only difference is that the BL and BLB values are opposite (i.e., one has bit value 0 and the other has bit value 1) during the conventional write process. In an important feature of the invention, the time required by the retrieve process of FIG. 4 is substantially the same as the time required by conventional SRAM read and write processes and that this latter time is substantially unchanged by the threshold-voltage difference of the memory cell 24 of FIG. 2.

As shown by the above description, a read/write memory cell of the invention is fabricated to have a predetermined latent state which is realized with a predetermined threshold-voltage difference in the memory cell's pull-up transistors. The threshold-voltage difference is oriented to ensure that the memory cell's inverters attain the predetermined latent state when its pass transistors decouple the inverters from a signal that turns off the pull-down transistors (and turns on the pull-up transistors). This latter process is exemplified in FIG. 4 where the word line WL transitions from high to low to thereby isolate the memory cell (24 in FIG. 2) from the bit line BL and bit line bar BLB which are low at this time.

FIG. 1 illustrates an exemplary array 22 of the invention in which the memory cells 24 support read/write processes and, in addition, support a read-only process. For illustrative purposes, FIG. 1 shows a predetermined read-only pattern 70 of bit values 0 and 1 in the lower right corner of each memory cell 24. Because each of the memory cells 24 has a respective cell-position in the array 22 that corresponds with a known bit value, each cell can be provided with a threshold-voltage difference between the threshold voltages $V_t$ of its pull-up transistors which is oriented to ensure that its inverters attain a latent state consistent with the predetermined read-only pattern 70 and the cell's respective cell-position when the cell's pass transistors decouple its inverters from a signal that turns off it's pull-down transistors.

Thus, the array 22 has a latent-state pattern that matches the predetermined read-only pattern 70. When desired, all or a portion of the latent states of the array 22 can be retrieved with the latent-state retrieve process described above with reference to FIG. 4. Alternatively, data can be written to all or a portion of the array 22 with the conventional write process described above and subsequently, written data can be read with the conventional read process described above.

The array that provides the predetermined latent-state pattern can be fabricated with conventional photolithographic processes. These include a process of implanting impurities in the channel regions of the pull-up transistors (34 and 35 in FIG. 2) to realize a nominal threshold voltage $V_{t_{nom}}$. Subsequently, a mask is used that defines the channel region of an appropriate pull-up transistor in each memory cell (appropriate to the definition of bit values 0 and 1).

With this mask, additional impurities are implanted in the defined channel regions to realize the greater threshold voltages $V_{t_{gtr}}$ that provide the predetermined latent-state pattern. It is important to note that this single additional fabrication process does not increase the area of the memory cell so that a read/write memory of the invention contains the same amount of memory (for a given area) as a conventional read/write memory. It is also important to note that this additional fabrication process does not significantly affect the conventional read/write functions of the memory, i.e., it is transparent during conventional read/write functions.

Because of the properties of photolithographic fabrication processes, the nominal threshold voltages $V_{t_{nom}}$ and parasitic capacitances of a conventional memory cell's pull-up transistors will be substantially identical and any threshold-voltage difference will be unknown. Accordingly, a conventional memory would only produce a random pattern if subjected to the latent-state retrieve process described above. Because this pattern is random and indeterminable, it has no value.

In contrast, a read/write memory of the current invention will provide a predetermined read-only pattern (e.g., the pattern 70 of FIG. 1) in response to the latent-state retrieve process. The read-only pattern can be fabricated to match any desired predetermined pattern. Although a reliable threshold-voltage difference (established by the nominal threshold voltage $V_{t_{nom}}$ and the greater threshold voltage $V_{t_{gtr}}$) can be as small as a few millivolts, it may be desirable to enhance reliability by requiring that it have a minimum value, e.g., at least 100 millivolts or, more preferably, at least 200 millivolts.

Figure 5:
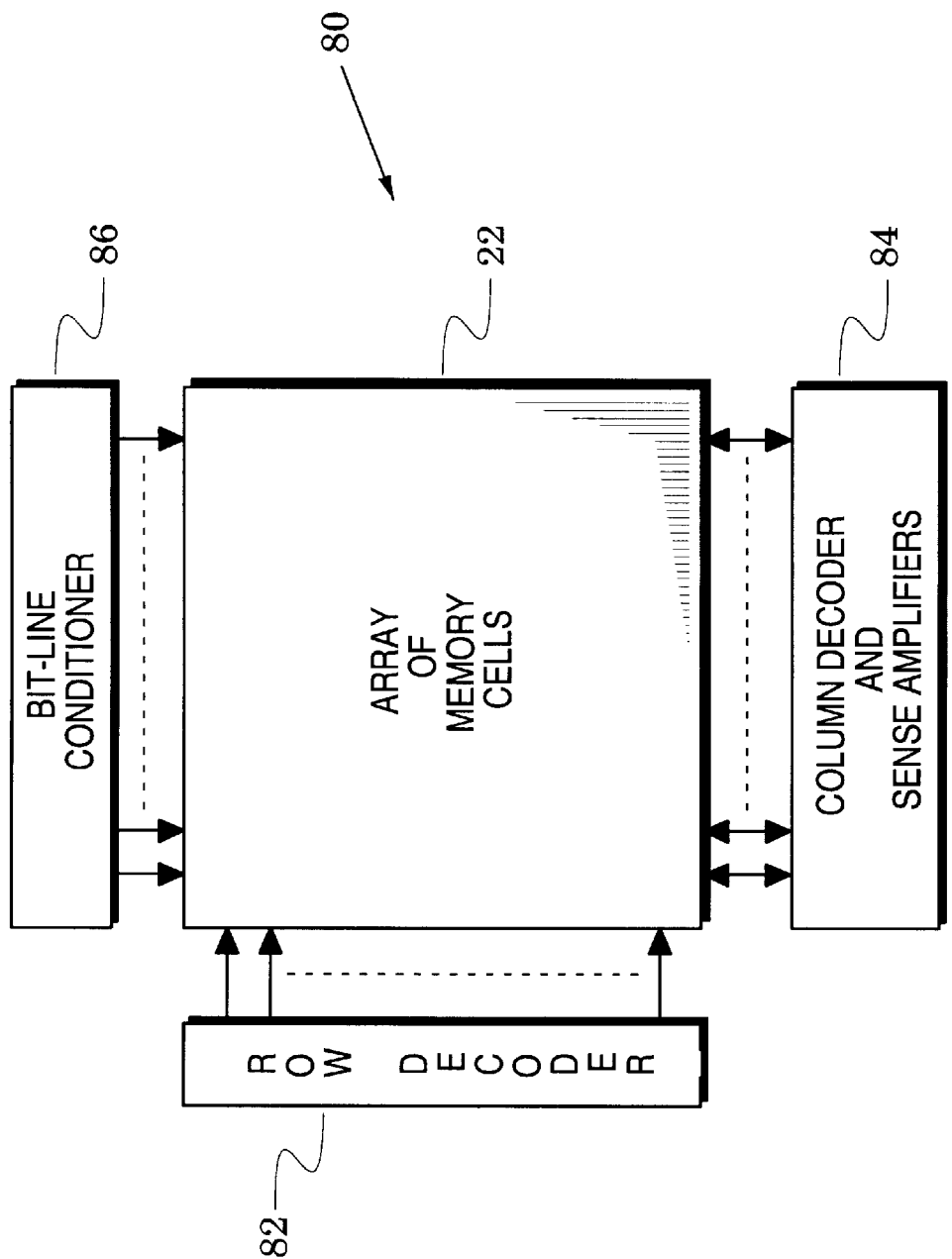
FIG. 5 is a block diagram of a memory that includes the array of FIG. 1.

The memory 22 of FIG. 1 may be supplemented with the structures of FIG. 5 which illustrates a memory 80 that adds a row decoder 82, a column decoder and sense amplifier 84 and a bit-line conditioner 86. As shown in FIG. 1, the memory 22 is generally organized in rows and columns and the row decoder 82 selectively activates a selected word line (e.g., WL1) to thereby turn on the first and second pass transistors (38 and 39 in FIG. 2) of all memory cells in the corresponding row.

Similarly, a column decoder in the column decoder and sense amplifier 84 selectively couples output signals (via appropriate bit-line pairs) from the first and second pass transistors of any memory cell in the selected row to a sense amplifier whose output then corresponds to the memory cell's current state. Alternatively, data can be written into a selected memory cell by placing data on appropriate bit-line pairs with the bit-line conditioner 86. The bit-line conditioner 86 may also be used to pre-charge selected bit-line pairs to thereby aid in reading cell states with a sense amplifier 84 through the column decoder.

Figure 6:
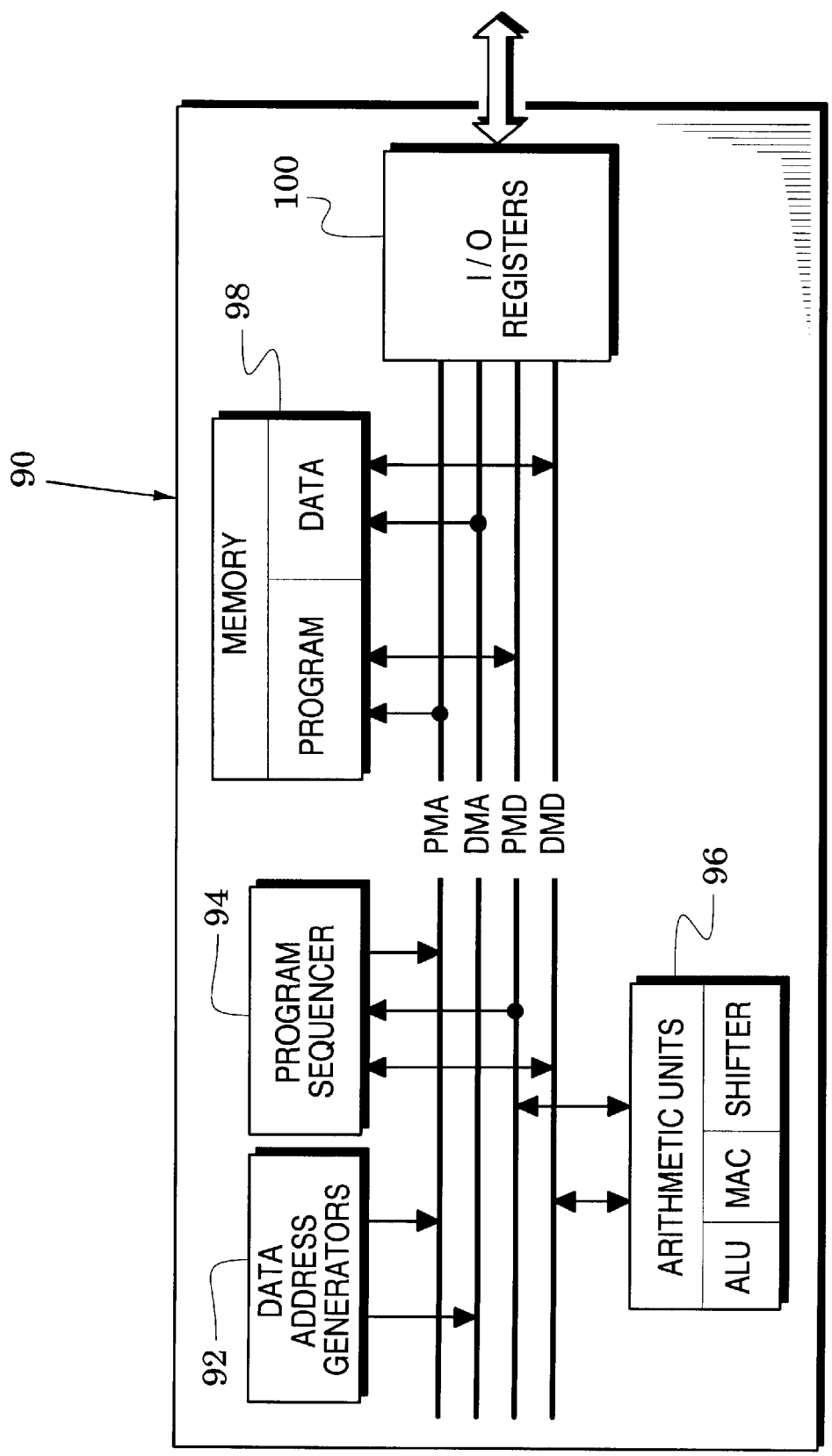
FIG. 6 is a block diagram of a digital signal processor that includes the memory of FIG. 5.

Although the memory embodiments of the invention can be used wherever there is a need for read/write and read-only memory, a significant use can be found in digital signal processors such as the processor 90 of FIG. 6. The processor includes data address generators 92, a program sequencer 94, arithmetic units 96, a memory 98 and input/output (I/O) registers 100. These structures communicate through a program memory address bus (PMA), a data memory address bus (DMA), a program memory data bus (PMD) and a data memory data bus (DMD).

In particular, the data address generators 92 provide memory addresses via the PMA and DMA busses as memory data is interchanged with the. I/O registers 100. The program sequencer 94 supplies instruction addresses via the PMA bus to the memory 98 in response to program instructions received via the PMD bus.

The arithmetic units 96 includes independent computational units. For example, an arithmetic logic unit (ALU) provides arithmetic and logic functions, a multiplier-accumulator (MAC) performs multiply, multiply/add and multiply/subtract functions and a shifter performs logical and arithmetical shifts, normalization and derive-exponent operations. Incoming .data and computational products of the arithmetic units 96 are interchanged with the PMD and DMD busses.

The PMA and DMA busses are used internally for addresses associated with program and data memory in the memory 98. The PMD and DMD busses are use for data associated with the memory 98 and the PMD bus also transfers data to and from the arithmetic units 96.

Significant processing flexibility is added to the processor 90 by structuring all or a portion of the memory 98 with read/write memory embodiments of the present invention. Requirements for the amount of read/write and read-only memory will change as the processor is programmed to execute different objectives. With a memory embodiment of the present invention, corresponding changes can be made in allocation of memory assets.

Although memory embodiments have generally been described with reference to the memory cell of FIG. 2, the teachings of the invention can realize a predetermined latent state with any memory cell that includes at least first and second transistors and a threshold-voltage difference between the threshold voltages $V_t$ of the first and second transistors which is oriented to ensure that the memory cell attains the predetermined latent state when the first and second transistors are activated.

Although embodiments of the invention have been illustrated with reference to p-type and n-type metal oxide semiconductor transistors, the invention's teachings can be practiced with any transistors that have current terminals (e.g., collectors) that respond to signals at control terminals (e.g., bases).

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A read/write memory cell that has a predetermined latent state, said memory cell comprising at least first and second transistors and a fabricated threshold-voltage difference between the threshold voltages $V_t$ of said first and second transistors which is oriented to ensure that said memory cell attains said predetermined latent state when said first and second transistors are activated.

2. The memory cell of claim 1, further including:
   cross-coupled -first and second inverters which each include pull-up and pull-down transistors that have coupled current terminals and coupled control terminals; and
   first and second pass transistors that are respectively connected to the coupled current terminals of said first and second inverters;
   wherein said pull-up transistors -are said first and second transistors and are activated when said pass transistors decouple said inverters from a signal that turns off said pull-down transistors.

3. The memory cell of claim 1, wherein said threshold-voltage difference is at least 100 millivolts.

4. The memory cell of claim 1, wherein said threshold-voltage difference is at least 200 millivolts.

5. The memory cell of claim 2, wherein said pull-up transistors are p-type metal oxide semiconductor (MOS)

transistors and said pull-down transistors and said pass transistors are n-type MOS transistors.

6. The memory cell of claim 2, wherein said -threshold-voltage difference comprises:
   a nominal threshold voltage $V_{tnom}$ in one of said pull-up transistors; and
   a greater threshold voltage $V_{tgtr}$ in the other of said pull-up transistors which differs from said nominal threshold voltage $V_{tnom}$ to provide said threshold-voltage difference.

7. The memory cell of claim 6, wherein said pull-up transistors have channel regions and have different densities of p-type impurities in said channel regions to thereby realize said nominal threshold voltage $V_{tnom}$ and said greater threshold voltage $V_{tgtr}$.

8. The memory cell of claim 6, wherein said greater threshold voltage Vtgtr exceeds said nominal threshold voltage $V_{tnom}$.

9. The memory cell of claim 2, wherein said current terminals are drains and said control terminals are gates.

10. A read/write memory that has a predetermined latent-state pattern, comprising:
    an array of memory cells that each have:
      a) a respective cell-position in said array; and
      b) at least first and second transistors and a fabricated threshold-voltage difference between the threshold voltages $V_t$ of said first and second transistors which is oriented to ensure that the memory cell attains a latent state consistent with said latent-state pattern and said cell-position when said first and second transistors are activated.

11. The memory of claim 10, wherein each of said memory cells also has:
    a) cross-coupled first and second inverters which each include pull-up and pull-down transistors that have coupled current terminals and coupled control terminals; and
    b) first and second pass transistors that are respectively connected to the coupled current terminals of said first and second inverters;
       wherein said pull-up transistors are said first and second transistors and are activated when said pass transistors decouple said inverters from a signal that turns off said pull-down transistors.

12. The memory of claim 10, wherein said threshold-voltage difference is at least 100 millivolts.

13. The memory of claim 10, wherein said threshold-voltage difference is at least 200 millivolts.

14. The memory of claim 11, wherein said pull-up transistors are p-type metal oxide semiconductor (MOS) transistors and said pull-down transistors and said pass transistors are n-type MOS transistors.

15. The memory of claim 11, wherein said threshold-voltage difference comprises:
    a nominal threshold voltage $V_{tnom}$ in one of said pull-up transistors; and
    a greater threshold voltage $V_{tgtr}$ in the other of said pull-up transistors which differs from said nominal threshold voltage $V_{tnom}$ to thereby provide said threshold-voltage difference.

16. The memory of claim 15, wherein said pull-up transistors have channel regions and have different densities of p-type impurities in said channel regions to thereby realize said nominal threshold voltage $V_{tnom}$ and said greater threshold voltage $V_{tgtr}$.

17. The memory of claim 15, wherein said greater threshold voltage $V_{tgtr}$ exceeds said nominal threshold voltage $V_{tnom}$.

18. The memory of claim 11, wherein said memory cells are arranged in rows and columns of said array and further including:
    at least one sense amplifier;
    a row decoder that selectively turns on the first and second pass transistors of all memory cells of any selected one of said rows; and
    a column decoder that selectively couples the first and second pass transistors of any memory cell in said selected row to said sense amplifier.

19. The memory of claim 11, further including:
    bit lines that couple said first and second pass transistors to said sense amplifier; and
    a bit-line conditioner that precharges said bit lines.

20. The memory of claim 11, wherein said current terminals are drains and said control terminals are gates.

21. A method of manufacturing a read/write memory to have a predetermined latent-state pattern, comprising the steps of:
    providing an array of memory cells;
    arranging each of said memory cells to have a respective cell-position in said array; and
    configuring each of said memory cells to have at least first and second transistors and a fabricated threshold-voltage difference between the threshold voltages $V_t$ of said first and second transistors which is oriented to ensure that the memory cell attains a latent state consistent with said latent-state pattern and said cell-position when said first and second transistors are activated.

22. The method of claim 21, further including the steps of:
    in each of said memory cells,
      a) cross coupling first and second inverters which each include pull-up and pull-down transistors that have coupled current terminals and coupled control terminals; and
      b) respectively connecting first and second pass transistors to the coupled current terminals of said first and second inverters;
    wherein said pull-up transistors are said first and second transistors and are activated when said pass transistors decouple said inverters from a signal that turns off said pull-down transistors.

23. The method of claim 21, wherein said threshold-voltage difference is at least 100 millivolts.

24. The method of claim 21, wherein said threshold-voltage difference is at least 200 millivolts.

25. The method of claim 22, wherein said pull-up transistors are p-type metal oxide semiconductor (MOS) transistors and said pull-down transistors and said pass transistors are n-type MOS transistors.

26. The method of claim 22, wherein said pull-up transistors have channel regions and said providing step includes the step of implanting impurities in said channel regions to thereby realize said threshold-voltage difference.

27. The method of claim 22, wherein said providing step includes the step of realizing a nominal threshold voltage $V_{tnom}$ in one of said pull-up transistors and a greater threshold voltage $V_{tgtr}$ in the other of said pull-up transistors which differs from said nominal threshold voltage $V_{tnom}$ to thereby provide said threshold-voltage difference.

28. The method of claim 27, wherein said greater threshold voltage Vtgtr exceeds said nominal threshold voltage $V_{tnom}$.

29. The method of claim 27, wherein said realizing step includes the steps of:

implanting impurities in the channel regions of said pull-up transistors to realize said nominal threshold voltage $V_{tnom}$;

defining the channel region of one of said pull-up transistors with a mask; and implanting additional impurities in the defined channel region to realize said greater threshold voltage $V_{tgtr}$.

30. The method of claim 22, wherein said current terminals are drains and said control terminals are gates.

31. The method of claim 22, further including the steps of:

arranging said memory cells in rows and columns of said array; and providing:
  a) at least one sense amplifier;
  b) a row decoder that selectively turns on the first and second pass transistors of all memory cells of any selected one of said rows; and
  c) a column decoder that selectively couples the first and second pass transistors of any memory cell in said selected row to said sense amplifier.

32. The method of claim 22, including the steps of:

coupling said first and second pass transistors to said sense amplifier with a pair of bit lines; and providing a bit-line conditioner that precharges said bit lines.

33. A method of accessing a predetermined latent state in a read/write memory, comprising the steps of:

providing a read/write memory that has:
  a) cross-coupled first and second inverters which each include pull-up and pull-down transistors that have coupled current terminals and coupled control terminals;
  b) first and second pass transistors that are respectively connected to the coupled current terminals of said first and second inverters; and
  c) a fabricated threshold-voltage difference between the threshold voltages $V_t$ of said pull-up transistors which is oriented to ensure that said inverters attain said predetermined latent state when said pass transistors decouple said inverters from a signal that turns off said pull-down transistors;

turning on said first and second pass transistors;

coupling signals through said first and second pass transistors that turn off said pull-down transistors; and turning off said first and second pass transistors.

34. A digital signal processor, comprising:

a bus system;

data address generators coupled to said bus system to provide addresses;

an arithmetic unit coupled to said bus system to receive and process data;

a program sequencer coupled to said bus system to direct data;

an input/output structure coupled to said bus system to input and output data; and a read/write memory that is coupled to said bus system, has a predetermined latent-state pattern and includes an array of memory cells that each have:
  a) a respective cell-position in said array; and
  b) at least first and second transistors and a fabricated threshold-voltage difference between the threshold voltages $V_t$ of said first and second transistors which is oriented to ensure that the memory cell attains a latent state consistent with said latent-state pattern and said cell-position when said first and second transistors are activated.

35. The processor of claim 34, wherein each of said memory cells also has:
  a) cross-coupled first and second inverters which each include pull-up and pull-down transistors that have coupled current terminals and coupled control terminals; and
  b) first and second pass transistors that are respectively connected to the coupled current terminals of said first and second inverters;
    wherein said pull-up transistors are said first and second transistors and are activated when said pass transistors decouple said inverters from a signal that turns off said pull-down transistors.

36. The processor of claim 35, wherein said threshold-voltage difference comprises:

a nominal threshold voltage $V_{tnom}$ in one of said pull-up transistors; and a greater threshold voltage Vtgtr in the other of said pull-up transistors which differs from said nominal threshold voltage $V_{tnom}$ to thereby provide said threshold-voltage difference.

37. The processor of claim 36, wherein said pull-up transistors have channel regions and have different densities of p-type impurities in said channel regions to thereby realize said nominal threshold voltage $V_{tnom}$ and said greater threshold voltage $V_{tgtr}$.

38. The processor of claim 36, wherein said greater threshold voltage $V_{tgtr}$ exceeds said nominal threshold voltage $V_{tnom}$.

39. The processor of claim 35, wherein said current terminals are drains and said control terminals are gates.

40. The processor of claim 35, wherein said memory cells are arranged in rows and columns of said array and further including:

at least one sense amplifier;

a row decoder that selectively turns on the first and second pass transistors of all memory cells of any selected one of said rows; and a column decoder that selectively couples the first and second pass transistors of any memory cell in said selected row to said sense amplifier.

41. The processor of claim 40, wherein said first and second pass transistors are coupled to said sense amplifier by a pair of bit lines and further including a bit-line conditioner that precharges said bit lines.

42. The processor of claim 34, wherein said bus system includes:

a program memory address bus;

a data memory address bus;

a program memory data bus; and a data memory data bus.

43. The processor of claim 34, wherein said arithmetic unit includes:

an arithmetic logic unit;

a multiply accumulator; and a data shifter.

* * * * *